US010181482B2

(12) United States Patent
Li et al.

(10) Patent No.: US 10,181,482 B2
(45) Date of Patent: Jan. 15, 2019

(54) ARRAY SUBSTRATE AND MANUFACTURING METHOD THEREOF, AND DISPLAY DEVICE

(71) Applicant: BOE TECHNOLOGY GROUP CO., LTD., Beijing (CN)

(72) Inventors: Zhengliang Li, Beijing (CN); Qi Yao, Beijing (CN); Bin Zhang, Beijing (CN); Zhanfeng Cao, Beijing (CN); Wei Zhang, Beijing (CN); Xuefei Sun, Beijing (CN); Bin Zhou, Beijing (CN); Jincheng Gao, Beijing (CN)

(73) Assignee: BOE TECHNOLOGY GROUP CO., LTD. (CN)

( * ) Notice: Subject to any disclaimer, the term of this patent is extended or adjusted under 35 U.S.C. 154(b) by 0 days.

(21) Appl. No.: 15/306,550

(22) PCT Filed: Feb. 24, 2016

(86) PCT No.: PCT/CN2016/074427
§ 371 (c)(1),
(2) Date: Oct. 25, 2016

(87) PCT Pub. No.: WO2017/041447
PCT Pub. Date: Mar. 16, 2017

(65) Prior Publication Data
US 2017/0271373 A1 Sep. 21, 2017

(30) Foreign Application Priority Data
Sep. 7, 2015 (CN) .......................... 2015 1 0564851

(51) Int. Cl.
H01L 29/12 (2006.01)
H01L 27/12 (2006.01)
(Continued)

(52) U.S. Cl.
CPC ........ *H01L 27/1225* (2013.01); *H01L 21/027* (2013.01); *H01L 27/124* (2013.01);
(Continued)

(58) Field of Classification Search
CPC .......... H01L 27/124–27/1244; H01L 27/3297; H01L 27/3253; H01L 27/3248;
(Continued)

(56) References Cited

U.S. PATENT DOCUMENTS

2010/0060839 A1* 3/2010 Suzuki .................. H01L 27/124
349/147
2013/0134399 A1* 5/2013 Zhang .................. H01L 27/3274
257/40
(Continued)

FOREIGN PATENT DOCUMENTS

CN 102455593 A 5/2012
CN 102637636 A 8/2012
(Continued)

OTHER PUBLICATIONS

PCT International Search Report and Written Opinion dated Jun. 15, 2016, Application No. PCT/CN2016/074427, 12 Pages.
(Continued)

*Primary Examiner* — Kevin M Picardat
(74) *Attorney, Agent, or Firm* — Brooks Kushman P.C.

(57) ABSTRACT

According to an embodiment of the present disclosure, a method for manufacturing the array substrate includes forming a first transparent conductive layer and a metallic layer successively on a base substrate, and forming a gate electrode, a source electrode, a drain electrode and a first transparent electrode by one patterning process.

13 Claims, 4 Drawing Sheets

(51) Int. Cl.
*H01L 21/027* (2006.01)
*H01L 29/786* (2006.01)

(52) U.S. Cl.
CPC .... *H01L 27/1288* (2013.01); *H01L 29/78633* (2013.01); *H01L 29/78645* (2013.01)

(58) Field of Classification Search
CPC .................. H01L 27/1214–27/1296; H01L 27/3244–27/3279
USPC .............................................. 257/43
See application file for complete search history.

(56) References Cited

U.S. PATENT DOCUMENTS

| | | | |
|---|---|---|---|
| 2013/0200383 A1* | 8/2013 | Jia | H01L 27/124 257/66 |
| 2015/0028341 A1 | 1/2015 | Sun et al. | |
| 2015/0340383 A1* | 11/2015 | Lin | H01L 27/124 257/43 |
| 2016/0111442 A1* | 4/2016 | Wu | H01L 27/124 257/72 |

FOREIGN PATENT DOCUMENTS

| | | |
|---|---|---|
| CN | 102646792 A | 8/2012 |
| CN | 103107134 A | 5/2013 |
| CN | 103227147 A | 7/2013 |
| CN | 103383946 A | 11/2013 |
| CN | 104078492 A | 10/2014 |
| CN | 104637955 A | 5/2015 |
| CN | 105047610 A | 11/2015 |

OTHER PUBLICATIONS

First Office Action for Chinese Application No. 201510564851.3, dated Jul. 5, 2017, 6 Pages.
Second Office Action for Chinese Application No. 201510564851.3, dated Nov. 14, 2017, 5 Pages.

* cited by examiner

ARRAY SUBSTRATE AND MANUFACTURING METHOD THEREOF, AND DISPLAY DEVICE

CROSS-REFERENCE TO RELATED APPLICATIONS

This application is the U.S. national phase of PCT Application No. PCT/CN2016/074427 filed on Feb. 24, 2016, which claims priority to Chinese Patent Application No. 201510564851.3 filed on Sep. 7, 2015, the disclosures of which are incorporated in their entirety by reference herein.

TECHNICAL FIELD

The present disclosure relates to the field of display panels, and in particular, to an array substrate and a manufacturing method thereof, and a display device.

BACKGROUND

In electrical products made in recent years, such as the Flat Panel Display (FPD) and the thin film solar cell, thin film transistors (TFTs) are provided on a base substrate. The TFTs are key elements in a liquid crystal display (LCD) and greatly influence the performance of the display. Each liquid crystal pixel on the liquid crystal display is driven by a corresponding TFT behind the liquid crystal pixel, thereby displaying screen contents rapidly, with high brightness and with high contrast ratio.

In recent years, the low-temperature polysilicon display technology is widely applied due to high mobility of polysilicon, high aperture ratio and capability of being driver integrated achieved by reducing sizes of the TFTs. However, 9-13 patterning processes are required for manufacturing an HADS back plate, and the manufacturing cost is high due to a large number of patterning processes.

In view of the above, in related technologies, the array substrate should be manufactured through the large number of patterning processes, which results in low manufacturing efficiency, waste of the cost and low utilization rate of equipment.

SUMMARY

Technical Problems

The present disclosure provides in some embodiments an array substrate, a method for manufacturing the array substrate, and a display device, to reduce the number of patterning processes for manufacturing the array substrate, reduce the manufacturing cost and enhance manufacturing efficiency and utilization rate of equipment.

Technical Solutions

In a first aspect, a method for manufacturing an array substrate is provided according to some embodiments of the present disclosure. The method includes the following steps of: forming a first transparent conductive layer (TCO) and a metallic layer successively on a base substrate of the array substrate; and forming a gate electrode, a source electrode, a drain electrode and a first transparent electrode by one patterning process.

With the method for manufacturing the array substrate according to embodiments of the present disclosure, firstly, the first TCO is formed on the base substrate, then the metallic layer is formed on the first TCO, and finally the gate electrode, the source electrode, the drain electrode and the first transparent electrode are formed by one patterning process, thereby reducing the number of the patterning processes, reducing the manufacturing cost and improving the manufacturing efficiency and the utilization rate of equipment.

In one possible embodiment, the step of forming the gate electrode, the source electrode, the drain electrode and the first transparent electrode by one patterning process may include: forming a photoresist on the metallic layer; exposing the photoresist to generate a photoresist non-reserved region, a photoresist partially-reserved region and a photoresist completely-reserved region; removing the photoresit, the metallic layer and the first TCO in the photoresist non-reserved region; removing the photoresist in the photoresist partially-reserved region through ashing; removing the metallic layer in the photoresist partially-reserved region; and removing the photoresist in the photoresist completely-reserved region, to form the gate electrode, the source electrode, the drain electrode and the first transparent electrode.

In one possible embodiment, common electrode lines are formed simultaneously when forming the gate electrode, the source electrode, the drain electrode and the first transparent electrode by one patterning process.

In one possible embodiment, before forming the first TCO and the metallic layer successively on the base substrate, the method further includes successively forming an active layer and a gate insulating layer on the base substrate.

In one possible embodiment, after forming the gate electrode, the source electrode, the drain electrode and the first transparent electrode, the method further includes: forming a protective layer, wherein the active layer comprises a doped region; forming via-holes in the protective layer respectively at locations corresponding to the doped region of the active layer, the source electrode and the drain electrode, wherein the doped region of the active layer, the source electrode and the drain electrode are exposed through the via-holes; andforming a second TCO, forming a second transparent electrode, a first connection electrode for connecting the source electrode to the doped region of the active layer, and a second connection electrode for connecting the drain electrode to the doped region of the active layer through patterning; wherein the first connection electrode and the second connection electrode are located in the via-holes.

In one possible embodiment, the active layer is made of low-temperature polysilicon and the doped region is N-type doped.

In one possible embodiment, the second transparent electrode is a slit electrode.

In one possible embodiment, the first TCO and/or the second TCO comprises one of or any combination of the following materials: Indium Zinc Oxide (IZO), Indium Tin Oxide (ITO), Indium Gallium Zinc Oxide (IGZO), Indium Tin Zinc Oxide (ITZO), Tin Zinc Oxide (TZO), Gallium Zinc Oxide (GZO) and Indium Gallium Oxide (IGO).

In one possible embodiment, the gate electrode, the source electrode, the drain electrode, and the metallic layer on the first TCO used for forming the first transparent electrode are exposed simultaneously, to form the gate electrode, the source electrode, the drain electrode and the first transparent electrode.

In one possible embodiment, the step of removing the photoresist in the photoresist completely-reserved region includes: removing the photoresist covering the metallic layer used for forming the source electrode and the drain electrode, to expose a source electrode layer and a drain electrode layer and form the source electrode and the drain electrode; removing the photoresist on the metallic layer used for forming the gate electrode, to expose a gate electrode layer and form the gate electrode; and removing the photoresist used for forming the first transparent electrode, to expose all metal in the photoresist completely-reserved region and form the first transparent electrode.

In one possible embodiment, the step of removing the photoresist in the photoresist completely-reserved region includes: removing the photoresist on the metallic layer used for forming the gate electrode, to expose a gate electrode layer and form the gate electrode; removing the photoresist on the metallic layer used for forming the source electrode and the drain electrode, to expose a source electrode layer and a drain electrode layer and form the source electrode and the drain electrode; and removing the photoresist used for forming the first transparent electrode, to expose all metal in the photoresist completely-reserved region and form the first transparent electrode.

In one possible embodiment, the step of removing the photoresist in the photoresist completely-reserved region includes: removing the photoresist used for forming the first transparent electrode, to form the first transparent electrode; removing the photoresist on the metallic layer used for forming the source electrode and the drain electrode, to expose a source electrode layer and a drain electrode layer and form the source electrode and the drain electrode; and removing the photoresist on the metallic layer used for forming the gate electrode, to expose a gate electrode layer and form the gate electrode.

In one possible embodiment, the metallic layer includes one of or any combination of the following materials: molybdenum (Mo), chromium (Cr), titanium (Ti), tantalum (Ta), copper (Cu), gold (Au), aluminum (Al), silver (Ag) and wolfram (W).

In a second aspect, the present disclosure provides in some embodiments an array substrate, which is manufactured by the above method for manufacturing the array substrate.

In a third aspect, the present disclosure provides in some embodiments a display device including the above array substrate.

Beneficial Effects

The embodiments of the present disclosure have at least the following beneficial effects. With the array substrate, the method for manufacturing the array substrate, and the display device according to embodiments of the present disclosure, the number of patterning processes for manufacturing the array substrate is reduced, the manufacturing cost is reduced and manufacturing efficiency and utilization rate of equipment are enhanced.

BRIEF DESCRIPTION OF THE DRAWINGS

For clarifying technical solutions according to embodiments of the present disclosure and the related technologies, drawings to be used in descriptions of the embodiments or the related technologies are briefly introduced. Obviously, the described drawings are merely for a part of the embodiments of the present disclosure. The ordinary skilled in the art may obtain other drawings based on those described drawings without paying inventive efforts.

DETAILED DESCRIPTION

Figure 1:
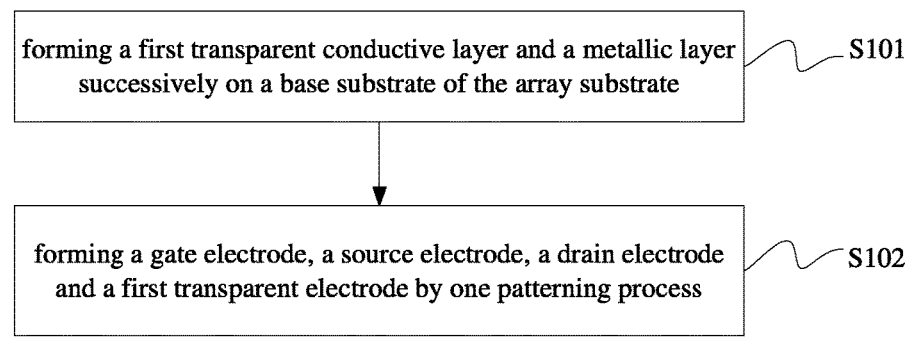
FIG. 1 is a flow chart of a method for manufacturing an array substrate according to some embodiments of the present disclosure.

Specific implementations of the present disclosure are detailed in conjunction with drawings and embodiments. The following described embodiments are intended to explain, rather than limit, the present disclosure.

For clarifying objectives, technical solutions and advantages of the present disclosure, the technical solutions are described clearly and completely in conjunction with drawings and embodiments. Apparently, the described embodiments are merely a part of, rather than all of, the embodiments. Any other embodiment obtained by those skilled in the art based on the embodiments of the present disclosure shall fall within the scope of the present disclosure.

Unless other definitions are given, technical terms or scientific terms used herein refer to normal meanings which can be understood by the ordinary skilled in the field to which the present disclosure relates. Terms such as "first" and "second" used in the specification and the list of claims of the present disclosure do not indicate any order, numbers or importance, and are merely used to distinguish different components. Similarly, terms such as "a" or "an" represent there exist at least one, rather than to limit the number. Terms such as "connected with" or "connected to" do not limit to physical or mechanical connections, and can include electrical connections which are either direct or indirect. Terms such as "on/above", "under/below", "left" and "right" are merely used to describe a relative position relationship; if the absolute position of one described object alters, the relative position relationship with respect to the described object alters correspondingly.

For clarifying objectives, technical solutions and advantages of the present disclosure, the technical solutions are described clearly and completely in conjunction with drawings and embodiments. Apparently, the described embodiments. Any other embodiment obtained by those skilled in the art based on the embodiments of the present disclosure without paying inventive efforts shall fall within the scope of the present disclosure.

An array substrate, a manufacturing method thereof and a display device are provided according to embodiments of the present disclosure, in order to reduce the number of patterning processes for the array substrate, reduce manufacturing cost of the array substrate, and improve manufacturing efficiency and utilization rate of equipment.

Implementations of the array substrate, the manufacturing method of the array substrate and the display device are detailed in conjunction with the drawings.

Thicknesses of respective films and sizes and shapes of regions occupied by the respective films shown in the drawings do not reflect actual features of the elements and are merely for illustrating the present disclosure exemplarily.

First Embodiment

Reference may be made to FIG. 1, which illustrates a method for manufacturing an array substrate according to an embodiment of the present disclosure. The method may include the following steps S101 and S102.

In step S101, a first transparent conductive layer (TCO) and a metallic layer are successively formed on a base substrate.

In step S102, a gate electrode, a source electrode, a drain electrode and a first transparent electrode are formed by one patterning process.

It should be noted that, the first transparent electrode is a common electrode. The patterning process in the embodiment of the present disclosure includes exposing and developing.

In one possible embodiment, before the step 101 of successively forming the first TCO and the metallic layer, the method further includes: successively forming an active layer and a gate insulating layer on the base substrate. That is to say, the active layer, the gate insulating layer, the first TCO and the metallic layer are successively formed on the base substrate.

In one possible embodiment, the step S102 of forming the gate electrode, the source electrode, the drain electrode and the first transparent electrode may include: forming a photoresist on the metallic layer; exposing the photoresist to generate a photoresist non-reserved region, a photoresist partially-reserved region and a photoresist completely-reserved region; removing the photoresit, the metallic layer and the first TCO in the photoresist non-reserved region; removing the photoresist in the photoresist partially-reserved region through ashing; removing the metallic layer in the photoresist partially-reserved region; and removing the photoresist in the photoresist completely-reserved region, to form the gate electrode, the source electrode, the drain electrode and the first transparent electrode.

In one possible embodiment, after forming the gate electrode, the source electrode, the drain electrode and the first transparent electrode, the method further includes: forming a protective layer, where the active layer includes a doped region; forming via-holes in the protective layer respectively at locations corresponding to the doped region of the active layer, the source electrode and the drain electrode, where the doped region of the active layer, the source electrode and the drain electrode are exposed through the via-holes; forming a second transparent conductive layer (TCO), forming a second transparent electrode, a first connection electrode for connecting the source electrode to the doped region of the active layer, and a second connection electrode for connecting the drain electrode to the doped region of the active layer through patterning. The first connection electrode and the second connection electrode are located in the via-holes.

It should be noted that, a first via-hole through which the doped region of the active layer is exposed, a second via-hole through which the source electrode is exposed, and a third via-hole through which the drain electrode is exposed are respectively formed in the protective layer at locations corresponding to the doped region of the active layer, the source electrode and the drain electrode. The first connection electrode for connecting the source electrode and the doped region of the active layer is formed by the second TCO at locations of the first via-hole and the second via-hole. In addition, the second connection electrode for connecting the drain electrode and the doped region of the active layer is formed at locations of the first via-hole and the third via-hole. In this way, the doped region of the active layer is connected to the source electrode through the first connection electrode and is connected to the drain electrode through the second connection electrode.

In one possible embodiment, the active layer is made of low-temperature polysilicon (P—Si), and the doped region is N-type doped.

In one possible embodiment, the second transparent electrode is a slit electrode.

In one possible embodiment, the step of removing the photoresist in the photoresist completely-reserved region to form the gate electrode, the source electrode, the drain electrode and the first transparent electrode may include:

in the photoresist completely-reserved region, firstly, removing the photoresist on the metallic layer used for forming the source electrode and the drain electrode, to expose a source electrode layer and a drain electrode layer and form the source electrode and the drain electrode; then, removing the photoresist on the metallic layer used for forming the gate electrode, to expose a gate electrode layer and form the gate electrode; and finally, removing the photoresist used for forming the first transparent electrode, to expose all the metal in the photoresist completely-reserved region and form the first transparent electrode; or in the photoresist completely-reserved region, firstly, removing the photoresist on the metallic layer used for forming the gate electrode, to expose a gate electrode layer and form the gate electrode; then, removing the photoresist on the metallic layer used for forming the source electrode and the drain electrode, to expose a source electrode layer and a drain electrode layer and form the source electrode and the drain electrode; and finally, removing the photoresist used for forming the first transparent electrode, to expose all the metal in the photoresist completely-reserved region and form the first transparent electrode; or in the photoresist completely-reserved region, firstly, removing the photoresist used for forming the first transparent electrode, to form the first transparent electrode; then, removing the photoresist on the metallic layer used for forming the source electrode and the drain electrode, to expose a source electrode layer and a drain electrode layer and form the source electrode and the drain electrode; and finally, removing the photoresist on the metallic layer used for forming the gate electrode, to expose a gate electrode layer and form the gate electrode.

It should be noted that, when removing the photoresist in the photoresist completely-reserved region, firstly the photoresist covering the metallic layer used for forming the source electrode and the drain electrode is removed, so as to expose the source electrode layer and the drain electrode layer and form the source electrode and the drain electrode, or firstly the photoresist covering the metallic layer used for forming the gate electrode is removed, so as to expose the gate electrode layer first and form the gate electrode, or firstly the photoresist covering the metallic layer on the first TCO used for forming the first transparent electrode is removed, so as to expose the metallic layer and form the first transparent electrode. Therefore, the manufacturing cost of the array substrate is reduced and the manufacturing efficiency is enhanced.

It should be noted that, the gate electrode, the source electrode, the drain electrode and the metallic layer on the first TCO used for forming the first transparent electrode may be exposed simultaneously according to process requirements.

The first TCO and/or the second TCO includes one of or any combination of the following materials: Indium Zinc Oxide (IZO), Indium Tin Oxide (ITO), Indium Gallium Zinc Oxide (IGZO), Indium Tin Zinc Oxide (ITZO), Tin Zinc Oxide (TZO), Gallium Zinc Oxide (GZO) and Indium Gallium Oxide (IGO).

It should be noted that, the first transparent electrode and the second transparent electrode according to the embodiment of the present disclosure may be made of one of the above-listed materials, or may be made of any combination of the above-listed materials, which is not limited herein. The metallic layer according to the embodiment of the present disclosure may include one of or any combination of the following materials: molybdenum (Mo), chromium (Cr), titanium (Ti), tantalum (Ta), copper (Cu), gold (Au), aluminum (Al), silver (Ag) and wolfram (W).

It should be noted that, the metallic material according to the embodiment of the present disclosure may be one of the above-listed metals, or may be any combination of the above-listed metals, which is not limited herein.

The photoresist covering the gate electrode, the source electrode, the drain electrode and the metallic layer on the first TCO may be formed with a duotone mask or a tritone mask through processes of coating, exposing, developing and so on.

Detailed explanation is given in conjunction with the drawings for clearly illustrating the method for manufacturing the array substrate.

The method for manufacturing the array substrate according to the embodiment of the present disclosure includes the following steps.

Figure 2:
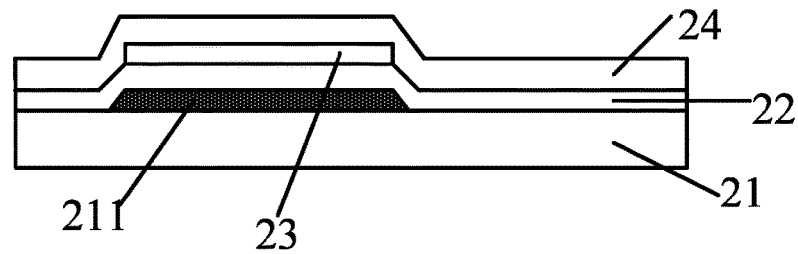
FIG. 2 is a first schematic structural diagram of a method for manufacturing an array substrate according to some embodiments of the present disclosure.

In a first step, as shown in FIG. 2, a buffering layer 22 is deposited on a base substrate 21 and a light shielding layer 211 provided on the base substrate 21, an active layer 23 is deposited on the buffering layer 22, and a gate insulating layer 24 is deposited on the active layer 23.

Figure 3:
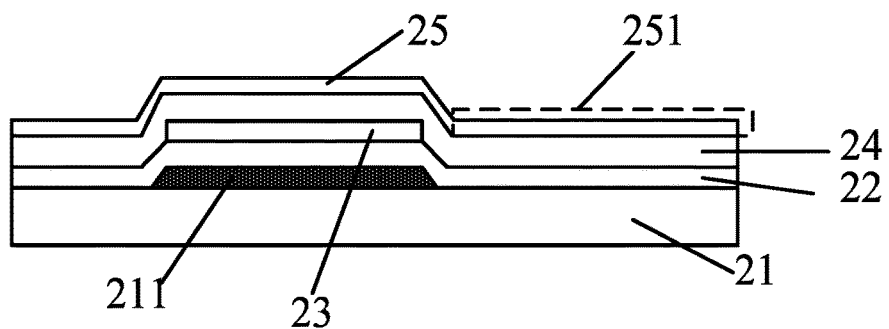
FIG. 3 is a second schematic structural diagram of a method for manufacturing an array substrate according to some embodiments of the present disclosure.

In a second step, as shown in FIG. 3, a first transparent conductive layer (TCO) 25 is deposited on the gate insulating layer 24 shown in FIG. 2. The first TCO 25 includes a transparent conductive layer that is located at a transparent region of the base substrate 21 and is configured to form a common electrode layer 251.

Figure 4:
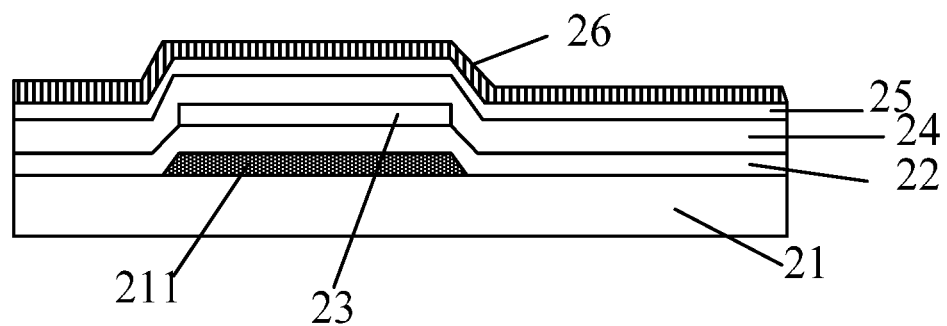
FIG. 4 is a third schematic structural diagram of a method for manufacturing an array substrate according to some embodiments of the present disclosure.

In a third step, as shown in FIG. 4, a metallic layer 26 is deposited on the first TCO 25 shown in FIG. 3.

Figure 5:
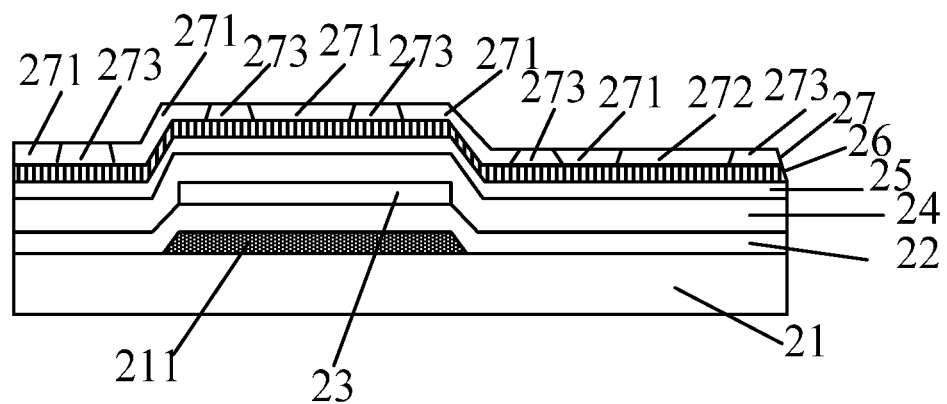
FIG. 5 is a fourth schematic structural diagram of a method for manufacturing an array substrate according to some embodiments of the present disclosure.

In a fourth step, as shown in FIG. 5, a photoresist layer 27 is deposited on the metallic layer 26 shown in FIG. 4, and the photoresist is exposed to form a photoresist non-reserved region 271, a photoresist partially-reserved region 272 and a photoresist completely-reserved region 273.

Figure 6:
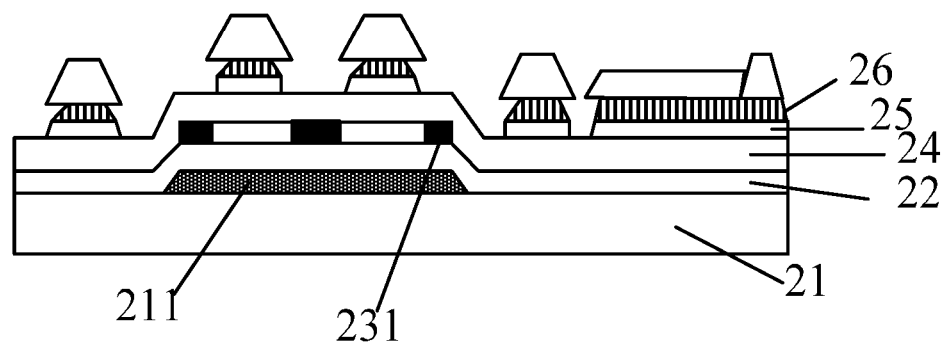
FIG. 6 is a fifth schematic structural diagram of a method for manufacturing an array substrate according to some embodiments of the present disclosure.

In a fifth step, as shown in FIG. 6, the photoresist, the metallic layer and the first TCO in the photoresist non-reserved region 271 are removed, and the active layer 23 is highly doped to generate a doped region 231.

Figure 7:
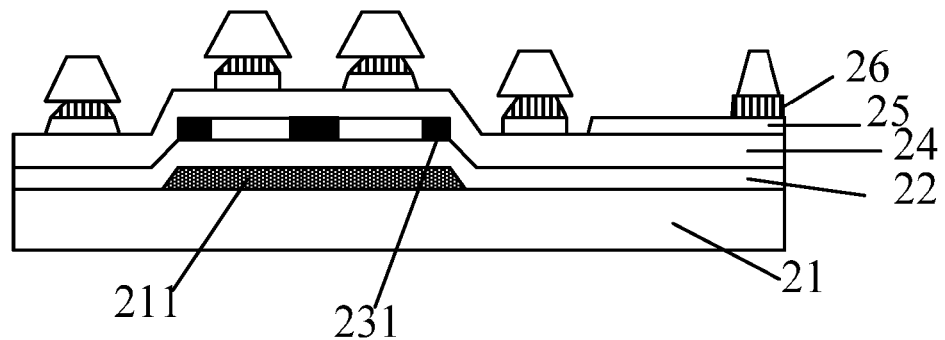
FIG. 7 is a sixth schematic structural diagram of a method for manufacturing an array substrate according to some embodiments of the present disclosure.

In a sixth step, as shown in FIG. 7, the photoresist and the metallic layer in the photoresist partially-reserved region 272 are removed through ashing.

Figure 8:
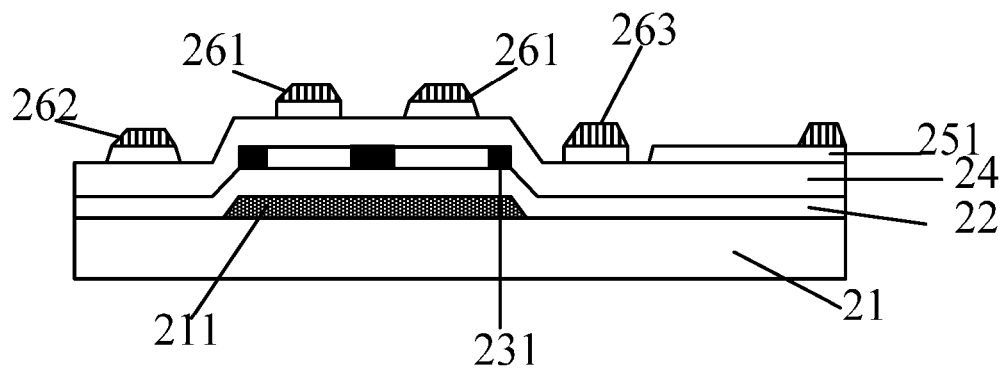
FIG. 8 is a seventh schematic structural diagram of a method for manufacturing an array substrate according to some embodiments of the present disclosure.

In a seventh step, as shown in FIG. 8, the photoresist in the photoresist completely-reserved region 273 is removed to form a gate electrode 261, a source electrode 262, a drain electrode 263 and a first transparent electrode 251.

Figure 9:
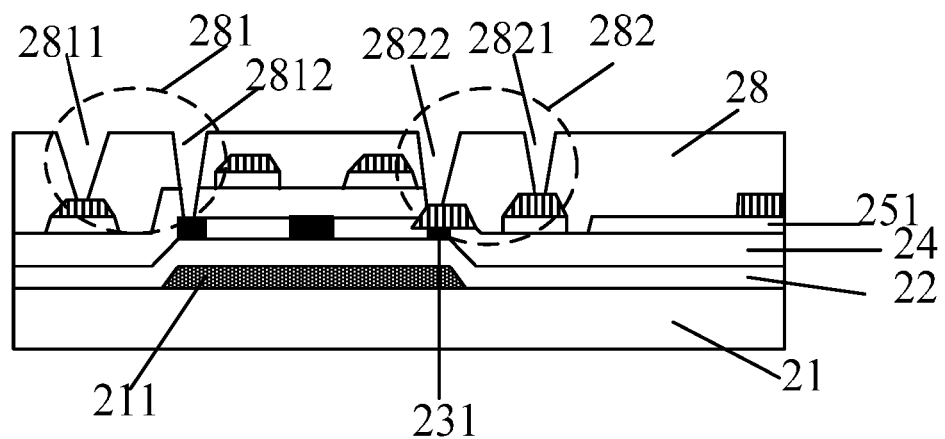
FIG. 9 is an eighth schematic structural diagram of a method for manufacturing an array substrate according to some embodiments of the present disclosure.

In an eighth step, as shown in FIG. 9, a protective layer 28 is formed, and a via-hole 281 for connecting the doped region 231 of the active layer and the source electrode 262 as well as a via-hole 282 for connecting the doped region 231 of the active layer and the drain electrode 263 are formed simultaneously. The via-hole 281 includes a second via-hole 2811 above the source electrode 262 and a first via-hole 2812 above the doped region 231 of the active layer. The via-hole 282 includes a third via-hole 2821 above the drain electrode 263 and a fourth via-hole 2822 above the doped region 231 of the active layer.

Figure 10:
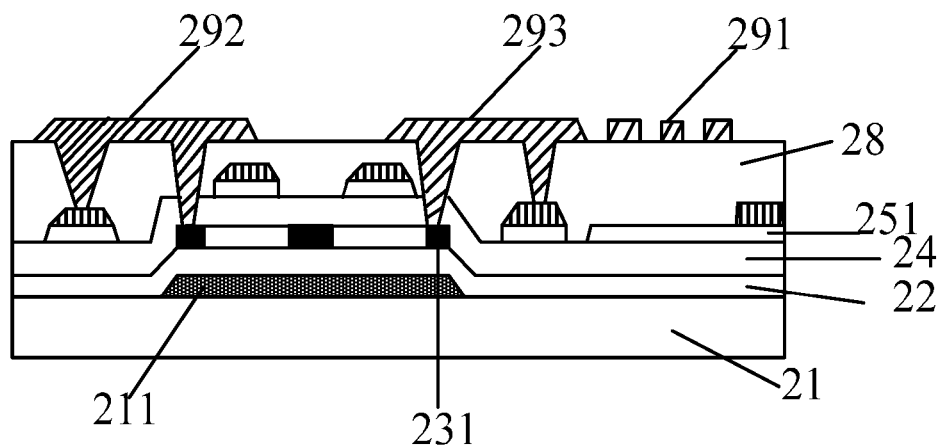
FIG. 10 is a ninth schematic structural diagram of a method for manufacturing an array substrate according to some embodiments of the present disclosure.

In a ninth step, as shown in FIG. 10, a second TCO is formed, a second transparent electrode 291, a first connection electrode 292 for connecting the source electrode and the doped region 231 of the active layer, and a second connection electrode 293 for connecting the drain electrode and the doped region 231 of the active layer are formed through patterning.

In sum, in the method for manufacturing the array substrate according to the embodiment of the present disclosure, firstly, a first patterning process includes forming the active layer and the gate insulating layer. A second patterning process includes: forming the first TCO on the gate insulating layer; forming the metallic layer on the first TCO; forming the photoresist on the metallic layer and exposing the photoresist to generate the photoresist non-reserved region, the photoresist partially-reserved region and the photoresist completely-reserved region; removing the photoresist, the metallic layer and the first TCO in the photoresist non-reserved region; removing the photoresist and the metallic layer in the photoresist partially-reserved region through ashing; and removing the photoresist in the photoresist completely-reserved region to form the gate electrode, the source electrode, the drain electrode and the first transparent electrode. In this way, the gate electrode, the source electrode, the drain electrode and the common electrode layer are formed in one patterning process. A third patterning process includes: forming the protective layer subsequent to the second patterning process. A fourth patterning process includes: forming the second transparent electrode and the connection electrodes subsequent to the third patterning process. Therefore, four patterning processes in all are performed to manufacture the array substrate according to the embodiment of the present disclosure, thereby reducing the number of patterning processes for manufacturing the array substrate, reducing the manufacturing cost of the array substrate, and improving the manufacturing efficiency and utilization rate of equipment.

Second Embodiment

An array substrate is further provided according to an embodiment of the present disclosure. The array substrate is manufactured by the method for manufacturing the array substrate provided in the foregoing embodiment.

Third Embodiment

A display device is further provided according to an embodiment of the present disclosure, which includes the array substrate according to the foregoing embodiment.

In sum, in the method for manufacturing the array substrate according to the embodiment of the present disclosure, the first TCO is formed on the gate insulating layer; the metallic layer is formed on the first TCO; the photoresist is formed on the metallic layer and is exposed to generate the photoresist non-reserved region, the photoresist partially-reserved region and the photoresist completely-reserved region; the photoresist, the metallic layer and the first TCO in the photoresist non-reserved region are removed; the photoresist and the metallic layer in the photoresist partially-reserved region are removed through ashing; and the photoresist in the photoresist completely-reserved region is removed to form the gate electrode, the source electrode, the drain electrode and the first transparent electrode. In this way, the gate electrode, the source electrode, the drain electrode and the common electrode layer are formed in one patterning process, thereby reducing the number of patterning processes for manufacturing the array substrate, reducing the manufacturing cost of the array substrate, and improving the manufacturing efficiency and utilization rate of equipment.

Obviously, the ordinary skilled in the art can make various modifications and changes without departing from the principle and scope of the present disclosure, and the present disclosure intends to include all those modifications and changes if they fall within the scope of protection of claims of the present disclosure and equivalent technologies.

What is claimed is:

1. A method for manufacturing an array substrate, comprising the following steps of:
    forming a first transparent conductive layer (TCO) and a metallic layer successively on a base substrate of the array substrate;
    forming a photoresist on the metallic layer;
    exposing the photoresist to generate a photoresist non-reserved region, a photoresist partially-reserved region and a photoresist completely-reserved region;
    removing the photoresist, the metallic layer and the first TCO in the photoresist non-reserved region;
    removing the photoresist in the photoresist partially-reserved region through ashing;
    removing the metallic layer in the photoresist partially-reserved region; and
    removing the photoresist in the photoresist completely-reserved region, to form the gate electrode, the source electrode, the drain electrode and the first transparent electrode.

2. The method according to claim 1, wherein common electrode lines are formed simultaneously when forming the gate electrode, the source electrode, the drain electrode and the first transparent electrode by one patterning process.

3. The method according to claim 1, wherein before forming the first TCO and the metallic layer successively on the base substrate, the method further comprises successively forming an active layer and a gate insulating layer on the base substrate.

4. The method according to claim 3, wherein after forming the gate electrode, the source electrode, the drain electrode and the first transparent electrode, the method further comprises:
    forming a protective layer, wherein the active layer comprises a doped region; forming via-holes in the protective layer respectively at locations corresponding to the doped region of the active layer, the source electrode and the drain electrode, wherein the doped region of the active layer, the source electrode and the drain electrode are exposed through the via-holes; and
    forming a second TCO, forming a second transparent electrode, a first connection electrode for connecting the source electrode to the doped region of the active layer, and a second connection electrode for connecting the drain electrode to the doped region of the active layer through patterning; wherein the first connection electrode and the second connection electrode are located in the via-holes.

5. The method according to claim 4, wherein the active layer is made of low-temperature polysilicon and the doped region is N-type doped.

6. The method according to claim 4, wherein the second transparent electrode is a slit electrode.

7. The method according to claim 4, wherein the first TCO and/or the second TCO comprises one of or any combination of the following materials: Indium Zinc Oxide (IZO), Indium Tin Oxide (ITO), Indium Gallium Zinc Oxide (IGZO), Indium Tin Zinc Oxide (ITZO), Tin Zinc Oxide (TZO), Gallium Zinc Oxide (GZO) and Indium Gallium Oxide (IGO).

8. The method according to claim 1, wherein the gate electrode, the source electrode, the drain electrode, and the metallic layer on the first TCO used for forming the first transparent electrode are exposed simultaneously, to form the gate electrode, the source electrode, the drain electrode and the first transparent electrode.

9. The method according to claim 1, wherein the step of removing the photoresist in the photoresist completely-reserved region comprises:
    removing the photoresist covering the metallic layer used for forming the source electrode and the drain electrode, to expose a source electrode layer and a drain electrode layer and form the source electrode and the drain electrode;
    removing the photoresist on the metallic layer used for forming the gate electrode, to expose a gate electrode layer and form the gate electrode; and
    removing the photoresist used for forming the first transparent electrode, to expose all metal in the photoresist completely-reserved region and form the first transparent electrode.

10. The method according to claim 1, wherein the step of removing the photoresist in the photoresist completely-reserved region comprises:
    removing the photoresist on the metallic layer used for forming the gate electrode, to expose a gate electrode layer and form the gate electrode;
    removing the photoresist on the metallic layer used for forming the source electrode and the drain electrode, to expose a source electrode layer and a drain electrode layer and form the source electrode and the drain electrode; and
    removing the photoresist used for forming the first transparent electrode, to expose all metal in the photoresist completely-reserved region and form the first transparent electrode.

11. The method according to claim 1, wherein the step of removing the photoresist in the photoresist completely-reserved region comprises:
    removing the photoresist used for forming the first transparent electrode, to form the first transparent electrode;
    removing the photoresist on the metallic layer used for forming the source electrode and the drain electrode, to expose a source electrode layer and a drain electrode layer and form the source electrode and the drain electrode; and removing the photoresist on the metallic layer used for forming the gate electrode, to expose a gate electrode layer and form the gate electrode.

12. The method according to claim 1, wherein the metallic layer comprises one of or any combination of the following materials: molybdenum (Mo), chromium (Cr), titanium (Ti), tantalum (Ta), copper (Cu), gold (Au), aluminum (Al), silver (Ag) and wolfram (W).

13. A method for manufacturing an array substrate, comprising the following steps of:
forming a first transparent conductive layer (TCO) and a metallic layer successively on a base substrate of the array substrate; and
forming a gate electrode, a source electrode, a drain electrode and a first transparent electrode by one patterning process,
wherein before forming the first TCO and the metallic layer successively on the base substrate, the method further comprises successively forming an active layer and a gate insulating layer on the base substrate, and
wherein after forming the gate electrode, the source electrode, the drain electrode and the first transparent electrode, the method further comprises:
forming a protective layer, wherein the active layer comprises a doped region; forming via-holes in the protective layer respectively at locations corresponding to the doped region of the active layer, the source electrode and the drain electrode, wherein the doped region of the active layer, the source electrode and the drain electrode are exposed through the via-holes; and
forming a second TCO, forming a second transparent electrode, a first connection electrode for connecting the source electrode to the doped region of the active layer, and a second connection electrode for connecting the drain electrode to the doped region of the active layer through patterning; wherein the first connection electrode and the second connection electrode are located in the via-holes.

* * * * *